(12) United States Patent
Watanabe

(10) Patent No.: US 7,839,441 B2
(45) Date of Patent: *Nov. 23, 2010

(54) AMPLIFICATION TYPE SOLID-STATE IMAGE PICKUP DEVICE

(75) Inventor: Takashi Watanabe, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 1517 days.

This patent is subject to a terminal disclaimer.

(21) Appl. No.: 11/191,293

(22) Filed: Jul. 28, 2005

(65) Prior Publication Data

US 2006/0023096 A1 Feb. 2, 2006

(30) Foreign Application Priority Data

Jul. 29, 2004 (JP) .......................... JP2004-221471

(51) Int. Cl.
*H04N 3/14* (2006.01)
*H04N 5/335* (2006.01)
*H01L 27/00* (2006.01)

(52) U.S. Cl. ..................... 348/300; 348/301; 250/208.1

(58) Field of Classification Search ......... 348/300–302, 348/304, 307–310, 241, 255; 250/208.1
See application file for complete search history.

(56) References Cited

U.S. PATENT DOCUMENTS 6,587,142 B1 * 7/2003 Kozlowski et al. .......... 348/241
6,635,857 B1 * 10/2003 Kindt ....................... 250/208.1
6,650,369 B2    11/2003 Koizumi et al.
6,674,471 B1 * 1/2004 Masuyama ................. 348/312
2002/0054390 A1 * 5/2002 Koizumi et al. ............ 358/513
2006/0023097 A1 * 2/2006 Watanabe ................... 348/308

FOREIGN PATENT DOCUMENTS

| JP | 9-46596      | 2/1997  |
| JP | 2001-085658 A | 3/2001  |
| JP | 2003-298942 A | 10/2003 |
| JP | 2004-023380 A | 1/2004  |

OTHER PUBLICATIONS

K. Inoue, et al., "*New LV-BPD (Low Voltage Buried Photo-Diode) for CMOS Imager*," International Electron Device Meeting (IEDM) Technical Digest, pp. 883-836, (1999).

* cited by examiner

*Primary Examiner*—David L Ometz
*Assistant Examiner*—Carramah J Quiett
(74) *Attorney, Agent, or Firm*—Edwards Angell Palmer & Dodge LLP; David G. Conlin; George N. Chaclas

(57) ABSTRACT

An control unit of the amplification type solid-state image pickup device, during a first period $T_2$, controls the gate voltage of the transfer transistor to a first gate voltage $V_1$ to make electrons as signal charge transferred from the phototransistor to the charge detection part. Also, the control unit, in a second period $T_3$ subsequent to the first period $T_2$, sets the gate of the transfer transistor to a high impedance and moreover, in a period $T_{PU}$ within the second period $T_3$, controls the gate voltage of the transfer transistor to a second gate voltage $V_2$ which allows power of transferring the signal charge to the charge detection part to be enhanced than the first gate voltage $V_1$.

7 Claims, 5 Drawing Sheets

US 7,839,441 B2

AMPLIFICATION TYPE SOLID-STATE IMAGE PICKUP DEVICE

This nonprovisional application claims priority under 35 U.S.C. §119(a) on Patent Application No(s). 2004-221471 filed in Japan on Jul. 29, 2004, the entire contents of which are hereby incorporated by reference.

BACKGROUND OF THE INVENTION

The present invention relates to an amplification type solid-state image pickup device having an amplification device (amplification circuit) in its pixel section. More specifically, the invention relates to an amplification type solid-state image pickup device which includes a plurality of pixels each having a photoelectric conversion element and a transfer transistor for transferring signal charge of the photoelectric conversion element, where signals derived from the individual pixels are amplified and read to output signal lines, respectively.

DESCRIPTION OF THE RELATED ART

Generally, there have been widely used amplification type solid-state image pickup devices in which a pixel section having an amplification function and a scanning circuit placed around the pixel section are included and in which pixel data from the pixel section are read out by the scanning circuit.

More specifically, as the amplification type solid-state image pickup device, there have been known APS (Active Pixel Sensor) type image sensors constructed of CMOS' (Complementary Metal Oxide Semiconductors) that are advantageous for the pixel section to be integrated with its peripheral driver circuit and signal processing circuit. In particular, there have been known APS type image sensors in which one photodiode (PD) and four MOS transistors (Tr) are used to make up the PD+4Tr method (see, e.g., I. Inoue et al., IEEE International Electron Devices Meeting (IEDM) Technical Digest), pp. 883-886 (1999), JP H09-746596 A).

FIG. 8 is a view showing one pixel section of an APS type image sensor according to the background art.

This APS type image sensor includes a photodiode 81 as a photoelectric conversion part, a transfer transistor 82 for transferring signal charge stored in the photodiode 81, an amplification device 83, a reset part 84 and a pixel selection part 85.

In FIG. 8, reference character $V_R$ denotes a reset drain power supply (constant voltage), $\phi_{TX}$ denotes a drive pulse for the transfer transistor 82, and $\phi_S$ denotes a drive pulse for the pixel selection part 85. Also, $V_{sig}$ denotes an output signal outputted from an output signal line (vertical signal line) 87.

FIG. 9 is a chart showing operation timings of a drive pulse $\phi_R$, the drive pulse $\phi_S$ and the drive pulse $\phi_{TX}$.

As shown in FIG. 9, in the background-art APS type image sensor, the reset-part drive pulse $\phi_R$ turn on (high level) in a period $T_R$ so that the potential of a charge detection part FD is reset to $V_R$. Then, simultaneously with or subsequent to the turn-on of $\phi_R$, the pixel-selection-part drive pulse $\phi_S$ turn on (high level), by which a potential of the charge detection part reset in a period $T_A$ is read out as an output signal $V_{sig}(R)$ via an amplification device 83, a pixel selection part 85 and a vertical signal line 87.

Thereafter, the transfer-part drive pulse $\phi_{TX}$ turn on (high level) in a period $T_X$, and signal charge is transferred from the photodiode 81 to the charge detection part FD. Since the pixel-selection-part drive pulse $\phi_S$ is in the on (high level) state, the charge-detection-part potential transferred in charge is read as an output signal $V_{sig}(S)$ in a period $T_B$ via the amplification device 83, the pixel selection part 85 and the vertical signal line 87.

In the arrangement shown in FIG. 8, on condition that the photodiode 81 is provided as a buried type one and on condition that a complete signal charge transfer from the photodiode 81 to the charge detection part FD is fulfilled, it becomes possible to achieve remarkable noise reduction so that a high quality image can be obtained.

However, there are issues shown below in achieving it.

FIG. 10 shows a cross-sectional structural view of a pixel having a buried type photodiode and its potential distribution diagram.

This pixel has a buried type photodiode which provides a P-type substrate 101, an N-type photoelectric conversion storage part 102 formed on the P-type substrate 101, and a highly-concentrative P-type pinning layer 103 formed on upper surface of the N-type photoelectric conversion storage part 102. Also in this pixel, on the P-type substrate 101 are formed a transfer gate 106 for transferring signal charge received from the buried type photodiode, and a charge detection part 104. A transfer pulse $\phi_{TX}$ is applied to the transfer gate 106 and a potential $V_{FD}$ is applied to the charge detection part 104. Area 105 may be an insulator that separates the part 102 and layer 103 from adjacent devices (not shown).

The transfer pulse $\phi_{TX}$ is supplied normally from a CMOS driver circuit, where the low level is GND and the high level is the power supply voltage $V_D$. The channel potential under gate in this case is given by $\Psi_0$, $\Psi_1$ as shown in FIG. 10.

In this case, the power supply voltage $V_D$ of the CMOS driver circuit is fixed and so that the voltage $V_D$ can not be large values, and the depletion potential $\Psi_d$ of the N-type photoelectric conversion storage part 102 cannot be made so shallow because the storable charge amount would be decreased.

Therefore, since the relation of magnitude of potential is that $\Psi_1 < \Psi_d$, charge $\Delta Q$ present in the potential region between $\Psi_1$ and $\Psi_d$ remains left, so that it is impossible to achieve a complete transfer of the charge $\Delta Q$ to the photodiode. This causes issues of occurrence of noise, which makes impossible to fulfill noise reduction, as well as occurrence of an image lag phenomenon.

SUMMARY OF THE INVENTION

Accordingly, an object of the present invention is to provide an amplification type solid-state image pickup device which is capable of performing a complete transfer of signal charge from the photodiode to the charge detection part so that high-quality images of less noise and less image lags can be obtained.

In order to accomplish the above object, there is proved an amplification type solid-state image pickup device comprising:

a pixel section having a photoelectric conversion element, a transfer transistor for transferring signal charge derived from the photoelectric conversion element, and an amplification device for amplifying signal charge transferred to a charge detection part by the transfer transistor; and a control unit for, during a first period, controlling a gate voltage of the transfer transistor to a first gate voltage to make the signal charge transferred from the photoelectric conversion element to the charge detection part, and for, in a second period subsequent to the first period, setting a gate of the transfer transistor to a high impedance and moreover for, in the second period, controlling the gate voltage of the transfer transistor to a second gate voltage which allows power of transferring the signal charge to the charge detection part to be enhanced than the first gate voltage.

According to this invention, the control unit, during the first period, controls the gate voltage of the transfer transistor to the first gate voltage to make the signal charge transferred from the photoelectric conversion element to the charge detection part, and thereafter, in the second period, controls the gate voltage of the transfer transistor to the second gate voltage which allows power of transferring the signal charge to the charge detection part to be enhanced than the first gate voltage. Therefore, charge transfer from the photoelectric conversion element to the charge detection part can be executed in two steps, and a charge transfer from the photoelectric conversion element to the charge detection part can execute completely, so that high-quality images of less noise and less image lags can be obtained.

In one embodiment, the photoelectric conversion element is a buried type photodiode.

According to this embodiment, since the photoelectric conversion element is a buried type photodiode, the photodiode becomes easier to completely deplete when the gate voltage of the transfer transistor is set to the second gate voltage. Thus, the charge transfer from the photoelectric conversion element to the charge detection part can be facilitated.

In one embodiment, further comprising a drive signal line capacitively coupled with the charge detection part via a first capacitance, wherein the control unit, in the second period, outputs to the drive signal line a control signal for controlling the gate voltage of the transfer transistor to the second gate voltage.

According to this embodiment, since the first capacitance is provided between the charge detection part and the drive signal line, the first capacitance can be utilized as a pull-up capacitance (for electrons serving as the signal charge) or a pull-down capacitance (for holes serving as the signal charge). Thus, only by the potential of the drive signal line being stepped up (for electrons serving as the signal charge) or stepped down (for holes serving as the signal charge), the gate voltage of the transfer transistor can easily be set to the second gate voltage.

In one embodiment, a second capacitance connected between the gate of the transfer transistor and the charge detection part is further comprised.

According to this embodiment, since the second capacitance is connected between the gate of the transfer transistor and the charge detection part, there can easily be generated a specified potential difference between the potential of the gate and the potential of the charge detection part during the second period. Thus, the gate voltage can easily be set to the second gate voltage during the second period.

In one embodiment, the control unit includes a drive circuit section and a control section for controlling the drive circuit section, the drive circuit section comprising:

a switching MOS transistor whose first terminal is connected to the gate of the transfer transistor;

a first switching element which, in the first period, turns on to make a gate terminal of the MOS transistor connected to ground and which, in the second period, turns off to make the gate terminal of the MOS transistor disconnected from the ground;

a second switching element which, in the first period, turns on to make a second terminal of the MOS transistor connected to power supply and which, in the second period, turns off; and a third switching element which, in the first period, turns off to make a first terminal of the MOS transistor and its gate terminal disconnected from each other and which, in the second period, turns on to make the gate terminal of the MOS transistor and its first terminal connected to each other, wherein in the second period, the first switching element and the second switching element turn off, whereby the gate of the transfer transistor is set to a high impedance state.

According to this embodiment, in the first period, the gate of the switching MOS transistor is connected to the ground, the second terminal of the switching MOS transistor is connected to the power supply, and the gate of the switching MOS transistor and the first terminal of the switching MOS transistor are disconnected from each other. Therefore, the gate voltage of the transfer transistor can easily be set to the first gate voltage by the power supply.

Further, according to this embodiment, in the second period, the gate of the switching MOS transistor is connected to the first terminal of the switching MOS transistor, the second terminal of the switching MOS transistor and the power supply are disconnected from each other, and the gate of the switching MOS transistor and the ground are disconnected from each other. Therefore, in the second period, a flow of current between gate and first terminal of the switching MOS transistor can be prevented, so that the gate of the transfer transistor can easily be maintained at high impedance.

In one embodiment, the control unit further comprises a voltage output blocking circuit having one end connected to a gate of the transfer transistor and serving to block voltages higher than the first gate voltage from being outputted from the other end of the voltage output blocking circuit.

According to this embodiment, by the provision of the voltage output blocking circuit that blocks voltages higher than the first gate voltage from being outputted from the other end of the voltage output blocking circuit, it never occurs that a voltage higher than the first gate voltage may be outputted from the other end during the second period. Thus, occurrence of malfunctions at the other end side of the voltage output blocking circuit can be prevented.

In one embodiment, a light receiving area in which a plurality of the pixel sections are arrayed in a matrix shape is formed, the amplification device is a switched capacitor amplifier whose input side is connected to an output side of the transfer transistor and whose output side is connected to an output signal line, and the control unit iterates control operation of reading a signal derived from the photoelectric conversion element via the transfer transistor by the switched capacitor amplifier part in each of the pixel sections.

According to this embodiment, the charge-voltage conversion gain can be determined not by the capacitance of the charge detection part, which is the output side of each transfer transistor, but by the capacitance inserted between input and output of the switched capacitor amplifier part. Therefore, for example, even if the capacitance of the charge detection part is increased by inserting the first capacitance between the drive signal line and the charge detection part, decreases of charge-voltage conversion gain can be prevented.

According to the amplification type solid-state image pickup device of the present invention, the control unit, during the first period, controls the gate voltage of the transfer transistor to a first gate voltage to make signal charge (electrons or holes) transferred from the photoelectric conversion element to the charge detection part, and thereafter, in the second period, sets the gate voltage of the transfer transistor to a second gate voltage which allows the power of transferring the signal charge to the charge detection part to be enhanced than the first gate voltage. Therefore, charge transfer from the photoelectric conversion element to the charge detection part can be executed in two steps and a charge transfer from the photoelectric conversion element to the charge detection part can execute completely, so that high-quality images of less noise and less image lags can be obtained.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the amplification type solid-state image pickup device of the present invention is described in detail by embodiments thereof illustrated in the accompanying drawings.

Figure 1:
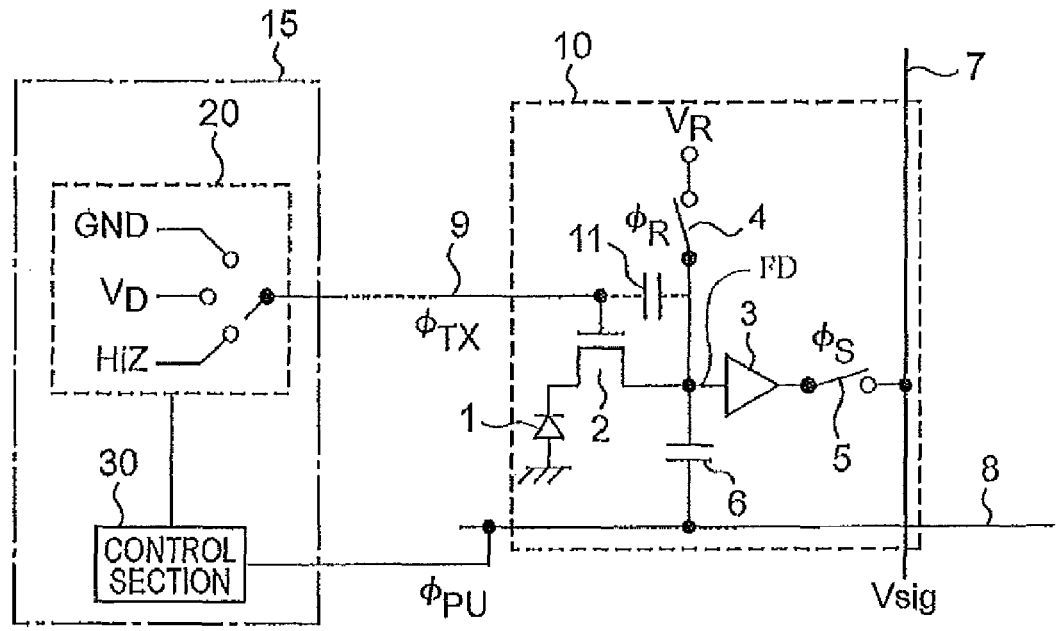
FIG. 1 is a circuit diagram showing main part of an amplification type solid-state image pickup device according to one embodiment of the present invention.

FIG. 1 is a circuit diagram showing part of an amplification type solid-state image pickup device according to one embodiment of the present invention.

This amplification type solid-state image pickup device includes a pixel section 10 and a control unit 15.

The pixel section 10 includes a buried type photodiode 1 as a photoelectric conversion element, a transfer transistor 2, an amplification device 3, a reset part 4, a selection part 5, a pull-up capacitance 6 as a first capacitance, an output signal line 7 and a transfer signal line 9.

The transfer transistor 2 serves for transferring, to a charge detection part FD, electrons as an example of signal charge stored in the photodiode 1. The amplification device 3 amplifies a signal received from the transfer transistor 2. The reset part 4 resets the charge detection part FD to a reset voltage $V_R$. The selection part 5 selects read of a signal received from the amplification device 3. The pull-up capacitance 6 is a capacitance for pulling up the potential of the charge detection part FD by a signal derived from the drive signal line 8. The output signal line 7 transfers a signal read by the selection part 5, and the transfer signal line 9 applies a transfer signal to a gate of the transfer transistor 2.

Also, a step-up capacitance 11 as a second capacitance is inserted between the charge detection part FD and the transfer signal line 9. The step-up capacitance 11 may be either a gate/source capacitance of the transfer transistor 2 as apparent from the indication by broken line in FIG. 1, or another capacitance formed specially. Also, reference characters $\phi_{TX}$, $\phi_R$, $\phi_S$ and $\phi_{PU}$ denote signals to be applied to the transfer transistor 2, the reset part 4, the selection part 5 and the drive signal line 8, respectively. It is noted that all of these elements do not necessarily need to be included in every pixel.

The control unit 15 includes a drive circuit section 20 and a control section 30. The drive circuit section 20 is a transfer signal generation circuit which feeds a transmitting signal to the transfer transistor 2 via the transfer signal line 9. The drive circuit section 20 is enabled to select from among three states, a first state that the transfer transistor 2 is in an off state (GND state), a second state that the transfer transistor 2 is in a first high level state ($V_D$ state), and a third state that the gate of the transfer transistor 2 is in a high impedance state (HiZ state).

After a transition from $V_D$ to HiZ state, a pulse that gives rise to a change to the high level is applied to the drive signal line 8, by which the potential of the charge detection part FD is changed to a second high level, which is further higher than the first high level, via the step-up capacitance 11. Then, by controlling the gate of the transfer transistor is changed, after the period of the first high level, to the second high level, which is further higher in potential, i.e. by controlling making the gate voltage of the transfer transistor stepped up in two steps so that a complete signal transfer from the photodiode 1 to the charge detection part FD is achievable. Further, the control section 30 feeds drive signals necessary for fulfillment of the above operation to the drive circuit section 20 and the drive signal line 8.

Figure 2A:
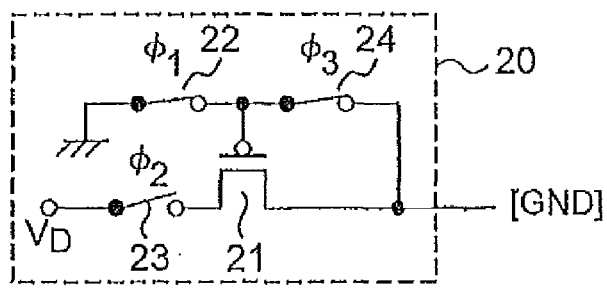
FIG. 2A is a view showing in detail the construction of the drive circuit section included in the amplification type solid-state image pickup device.
Figure 2B:
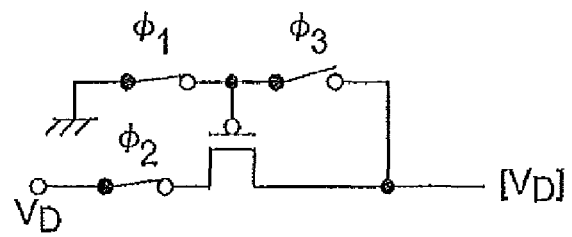
FIG. 2B is a view showing in detail the construction of the drive circuit section included in the amplification type solid-state image pickup device.
Figure 2C:
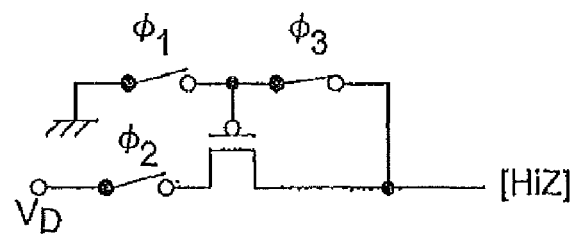
FIG. 2C is a view showing in detail the construction of the drive circuit section included in the amplification type solid-state image pickup device.

FIGS. 2A to 2C show one working example of the drive circuit section 20 shown in FIG. 1. More specifically, FIG. 2A represents the first state, FIG. 2B represents the second state, and FIG. 2C represents the third state. Referring to FIGS. 2A to 2C, reference numeral 21 denotes a P-type MOS transistor, and 22, 23 and 24 denote first, second and third switching elements which are driven by pulses $\phi_1$, $\phi_2$ and $\phi_3$, respectively, outputted by the control section 30.

As shown in FIGS. 2A, 2B and 2C, a source terminal that is a first terminal of the P-type MOS transistor 21 is connected to the gate of the transfer transistor 2 (see FIG. 1) via the transfer signal line 9. The first switching element 22 switches on (conducting) or off (nonconducting) the state between the gate terminal of the P-type MOS transistor 21 and the ground. The second switching element 23 switches on (conducting) or off (nonconducting) the state between the drain terminal, which is a second terminal of the P-type MOS transistor 21, and the power supply voltage $V_D$. The third switching element 24 switches on (conducting) or off (nonconducting) the state between the gate terminal of the P-type MOS transistor 21 and the first terminal of the P-type MOS transistor 21.

Figure 3:
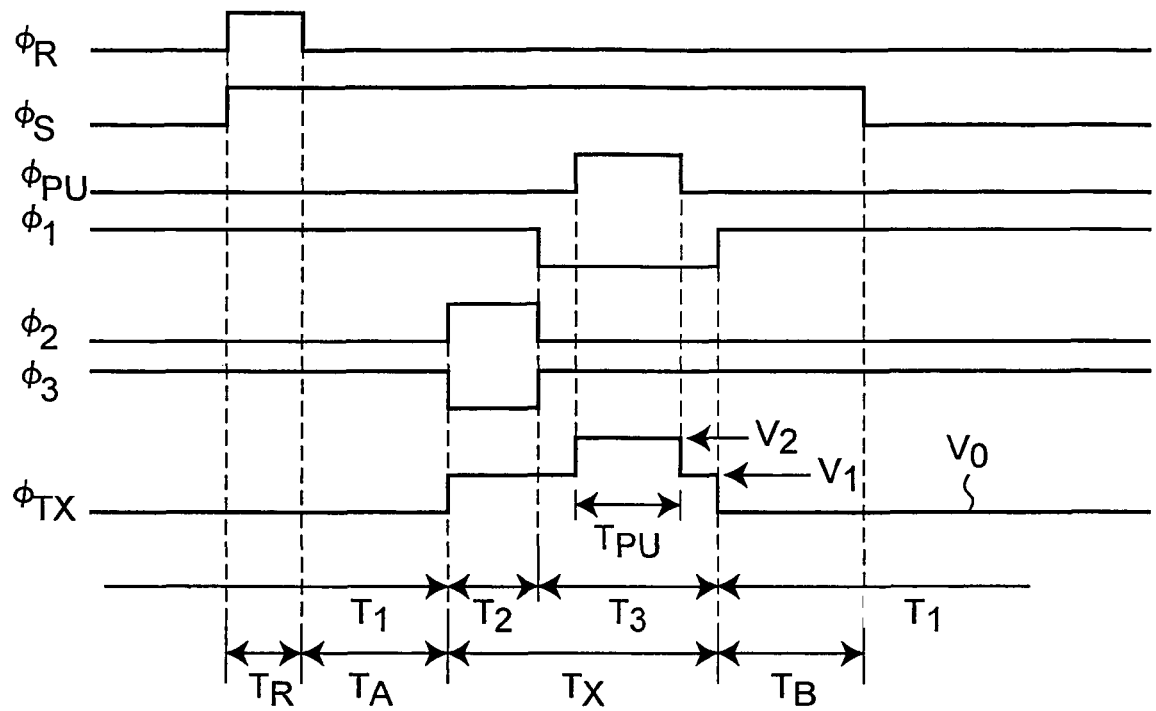
FIG. 3 is a chart showing operation timings of the amplification type solid-state image pickup device.

FIG. 3 is a timing chart for explaining operations in the individual states of FIGS. 2A to 2C.

Hereinbelow, operations of the pixel section are explained with reference to FIGS. 2A to 2C and FIG. 3.

Referring to FIG. 3, in a period $T_1$, the pulse $\phi_1$ is at high level (on), the pulse $\phi_2$ is at low level (off) and the pulse $\phi_3$ is at high level (on), which is the state of FIG. 2A. In this case, an output of the drive circuit section 20 is connected directly to the ground terminal, being at the ground level ($V_0$).

In a period $T_2$, which is a first period, the pulse $\phi_1$ is at high level (on), the pulse $\phi_2$ is at high level (on) and the pulse $\phi_3$ is at low level (off), which is the state of FIG. 2B. In this case, an output of the drive circuit section 20 is disconnected from the ground terminal, while the P-type MOS transistor is on so that its input side goes $V_D$, and the output of the drive circuit section 20 is set to the $V_D$ level ($V_1$). Thus, the gate voltage of the transfer transistor 2 is controlled to the first gate voltage $V_1$.

In a period $T_3$, which is a second period, the pulse $\phi_1$ is at low level (off), the pulse $\phi_2$ is at low level (off) and the pulse $\phi_3$ is at high level (on), which is the state of FIG. 2C. In this case, the input side of the drive circuit section 20 is open and is connected nowhere. On the output side of the drive circuit section 20, gate and source of the P-type MOS transistor are connected to each other. In this case, on condition that the P-type MOS transistor is an enhancement MOS, there flows no current between source and gate even if the source potential becomes higher than a power supply voltage for use in the normal state, so that the off state is held. As a result of this, the output side of the drive circuit section 20 can be set to the high impedance state, and the gate of the transfer transistor 2 can be set to the high impedance state.

In a period $T_{PU}$, which is a period within the second period $T_3$ during which the output side of the drive circuit section 20 is in the high impedance state, the control section 30 steps up the potential of the pulse $\phi_{PU}$ applied to the drive signal line 8, by which the potential of the transfer signal line 9 is stepped up from the first high level $V_1$, which is the first gate voltage, to the second high level $V_2$, which is the second gate voltage, via the step-up capacitance 11. That is, the gate voltage of the transfer transistor 2 is stepped up to the second gate voltage, which provides higher power for transferring signal-charge electrons to the charge detection part FD than the first gate voltage, thus allowing a complete transfer of electrons to the charge detection part FD to be achieved.

Operations other than those described above are similar to those of FIG. 7. That is, in the period $T_R$, the reset-part drive pulse $\phi_R$ turns on (high level), and the potential of the charge detection part FD is reset to $V_R$. Further, simultaneously with or subsequent to the turn-on of $\phi_R$, the pixel-selection-part drive pulse $\phi_S$ turns on (high level), and a potential of the charge detection part reset in a period $T_A$ is read out as an output signal $V_{sig}(R)$ via the amplification device 3, the pixel selection part 5 and the output signal line (vertical signal line) 7.

Also, in a period $T_X$, the voltage step-up is performed in two steps as described above, by which the signal charge is completely transferred from the photodiode 1 to the charge detection part FD. Then, since the pixel-selection-part drive pulse $\phi_S$ being in the on (high level) state, the charge-detection-part potential transferred in charge is read as an output signal $V_{sig}(S)$ in a period $T_B$ via the amplification device 3, the pixel selection part 5 and the vertical signal line 7.

Figure 4:
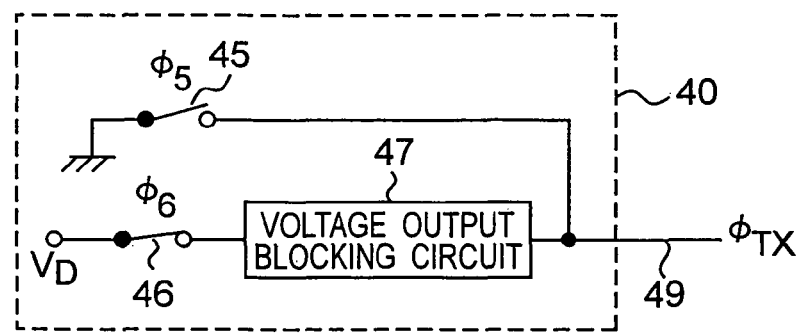
FIG. 4 is a view showing one working example of the drive circuit section.

FIG. 4 is a view showing another working example of the drive circuit section.

Referring to FIG. 4, a drive circuit section 40 outputs a signal $\phi_{TX}$ to a transfer signal line 49. The drive circuit section 40 is composed of a switching element 45 for controlling the application of the GND level to implement the low level, a switching element 46 for controlling the application of the $V_D$ level to implement the first high level, and a voltage output blocking circuit 47 connected between the transfer signal line 49 and the switching element 46 and serving for blocking voltages equal to or higher than the first gate voltage from being applied to the switching element 46.

Figure 5:
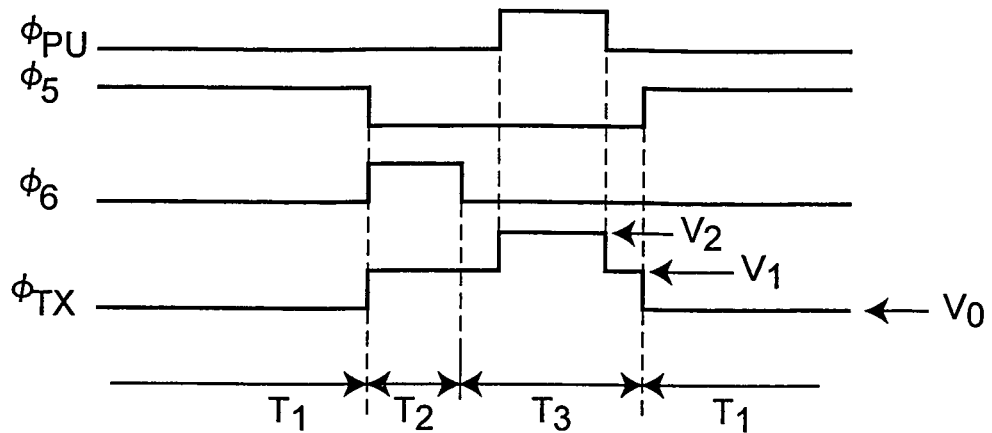
FIG. 5 is a timing chart representing operations of the drive circuit section of the one working example.

FIG. 5 is a timing chart representing operations of the drive circuit section 40.

In the drive circuit section 40 of the another working example, as shown in FIG. 5, in a period $T_1$, the pulse $\phi_5$ is at high level (on), the pulse $\phi_6$ is at low level (off), and the voltage of $\phi_{TX}$ applied to the transfer signal line 49 is the GND voltage, i.e., $V_0$. Also, in a period $T_2$ as a first period, the pulse $\phi_5$ is at low level (off), and the pulse $\phi_6$ is at high level (on), where the voltage of $\phi_{TX}$ applied to the transfer signal line 49 is a voltage of $V_D=V_1$. In this way, the gate voltage of the transfer transistor is set to $V_1$, which is the first gate voltage. Further, in a period $T_3$ as a second period, the pulses $\phi_5$ and $\phi_6$ are both at low level (off), where the transfer signal line 49 is in the high impedance state. At this time, the potential of the drive signal line $\phi_{PU}$ capacitively coupled with the transfer signal line 49 is increased, by which the voltage of $\phi_{TX}$ is stepped up to $V_2$ within the period $T_3$ (where the gate voltage of the transfer transistor is set to $V_2$, which is the second gate voltage). At this time, without the voltage output blocking circuit 47 that blocks voltages equal to or higher than $V_D=V_1$, a voltage equal to or higher than $V_D$ would be applied to the switching element 46 that controls the application of $V_D$ (even if the switch is in the off state), so that malfunctions would be caused in normal CMOS switches. This is prevented by the insertion of the voltage output blocking circuit 47.

Figure 6:
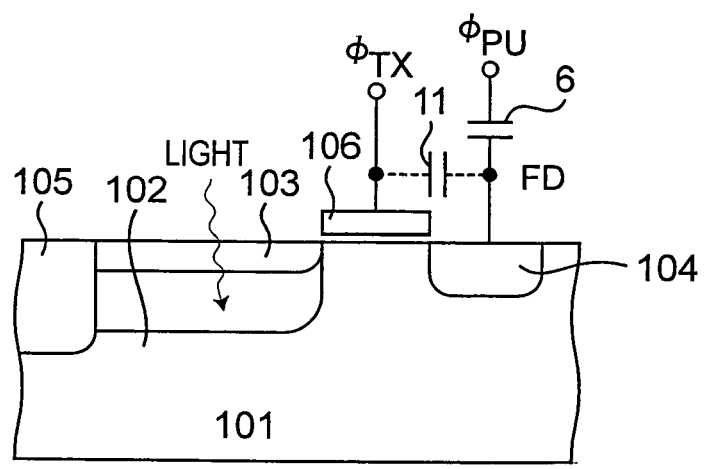
FIG. 6 is a cross-sectional structural view of a pixel included in the amplification type solid-state image pickup device of one embodiment of the invention, and is its potential distribution diagram.
Figure 6:
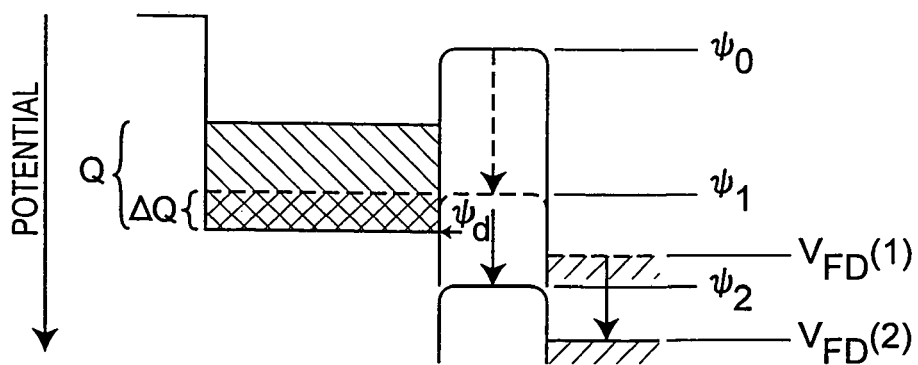

FIG. 6 shows a cross-sectional structural view of one pixel included in this embodiment, and its potential distribution diagram.

Figure 10:
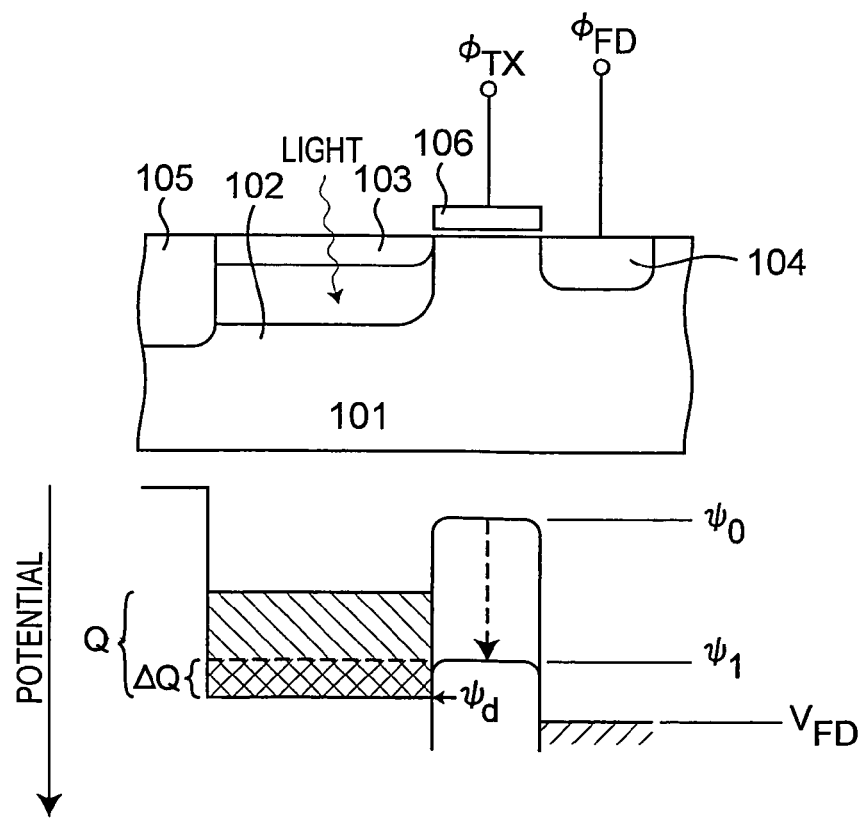
FIG. 10 is a cross-sectional structural view of a pixel of the background art and its potential distribution diagram.

It is noted that the same reference numerals of FIG. 6 as those of FIG. 10 represent the same components as those of FIG. 10, respectively.

This pixel has a buried type photodiode which has a P-type substrate 101, an N-type photoelectric conversion storage part 102 formed on the P-type substrate 101, and a highly-concentrative P-type pinning layer 103 formed on upper surface of the N-type photoelectric conversion storage part 102. Also in this pixel, on the P-type substrate 101 are formed a transfer gate 106 for transferring signal charge received from the buried type photodiode, and a charge detection part 104. A transfer pulse $\phi_{TX}$ is applied to the transfer gate 106 and a potential $V_{FD}$ is applied to the charge detection part 104.

Further in this pixel, unlike the background art example shown in FIG. 10, a drive signal $\phi_{PU}$ is applied to the charge detection part FD via the pull-up capacitance 6, and a step-up capacitance 11 is connected between the charge detection part FD and the gate 106 of the transfer transistor. A pulse of a waveform indicated as $\phi_{TX}$ in FIG. 3 is used as the pulse $\phi_{TX}$ to be applied to the gate 106 of the transfer transistor.

As the potential of the charge detection part FD is stepped up from an initial potential $V_{FD}(1)$ to $V_{FD}(2)$ by the drive signal $\phi_{PU}$, the transfer pulse $\phi_{TX}$ is stepped up from the ground potential ($V_0$) to the first high level ($V_1$) and further to second high level ($V_2$). Then, along with this operation, the channel potential under gate in this case can be increased to $\Psi_0$, $\Psi_1$, and $\Psi_2$ in steps as shown in FIG. 6. As a result of this, the depletion potential $\Psi_d$ of the buried type photodiode layer 102 can be made to meet a relationship that $\Psi_2 > \Psi_d$, making it possible to completely eliminate the charge that resides in the photodiode so that a complete charge transfer can be achieved. Therefore, it becomes possible to fulfill noise reduction as well as prevention of image lags, so that signals of high image quality can be obtained.

Figure 7:
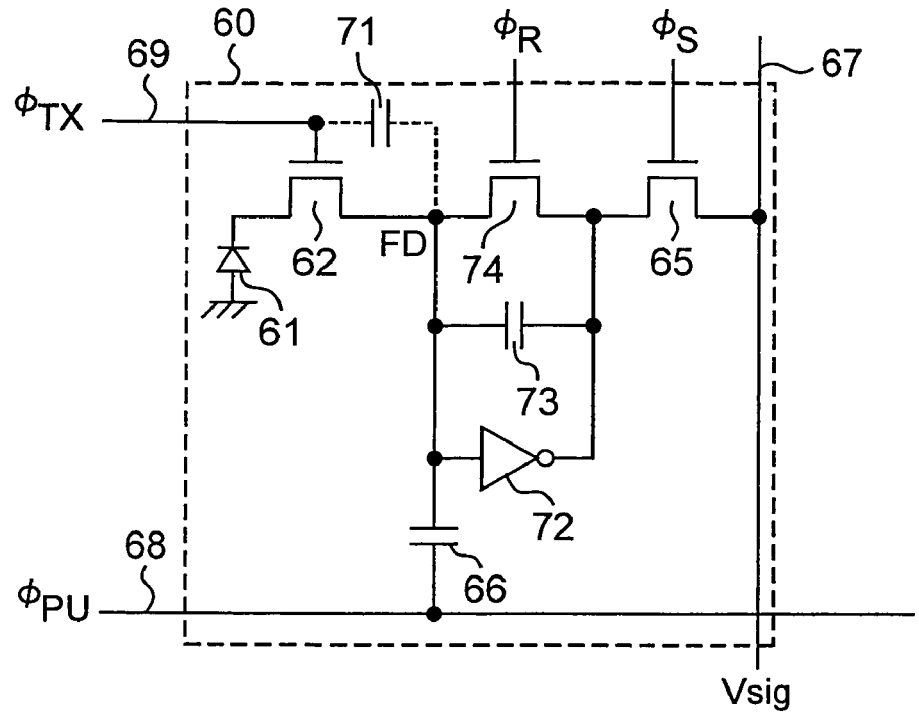
FIG. 7 is a view showing a pixel section included in an amplification type solid-state image pickup device according to another embodiment of the invention.
Figure 8:
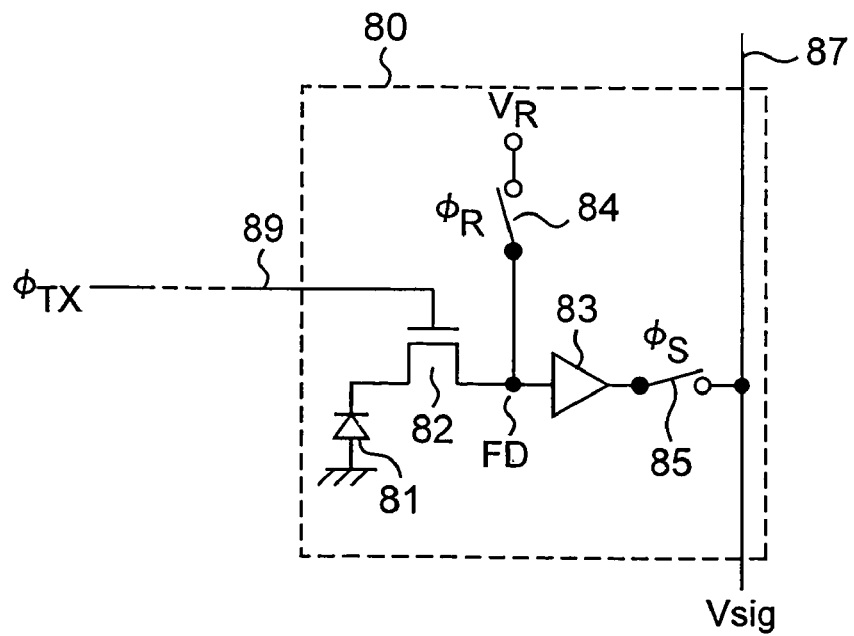
FIG. 8 is a view showing one pixel section of an APS type image sensor according to the background art.
Figure 9:
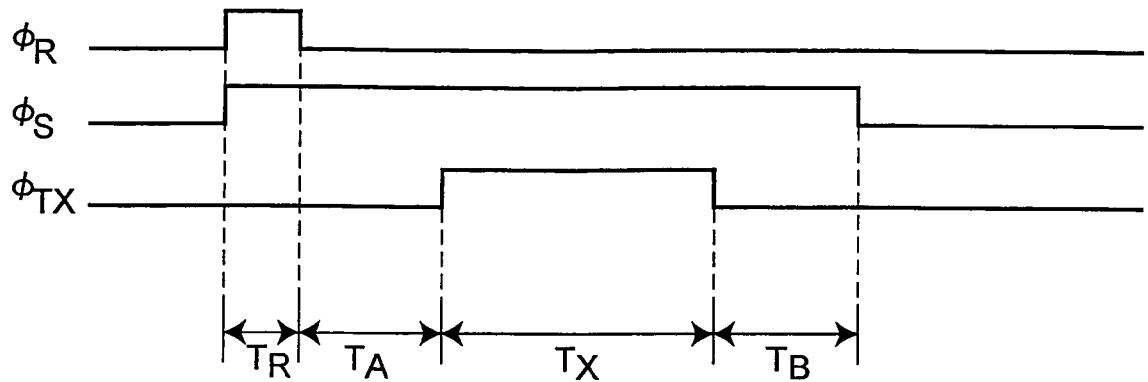
FIG. 9 is a chart showing operation timings of various drive pulses.

FIG. 7 is a view showing a pixel section 60 according to another embodiment of the invention.

As in the case of the pixel section shown by 10 in FIG. 1, the pixel section 60 shown in FIG. 7 includes a buried type photodiode 61 as a photoelectric conversion element, a transfer transistor 62 for transferring signal charge of the photodiode 61 to the charge detection part FD, a selection part 65 for selecting read of a signal received from the amplification device, a capacitance 66 for pulling up a potential of the charge detection part FD by a signal derived from a drive signal line 68, an output signal line 67 for transmitting a signal read by the selection part 65, and a transfer signal line 69 for applying a transfer signal to the transfer transistor 62.

The pixel section 60 shown in FIG. 7 differs in the amplification device and the charge voltage conversion part from the pixel section 10 shown in FIG. 1. More specifically, the pixel section 60 shown in FIG. 7 is provided with a switched capacitor amplifier part whose input side is connected to the output side of the transfer transistor 62 and whose output side is connected to the selection part 65. This switched capacitor amplifier part is made up of an inverting amplifier 72, a signal storage capacitance 73 connected between its input and output, and a reset part 74. When the gain of the inverting amplifier 72 is high enough, signal charge transferred from the photodiode 61 via the transfer part 62 is stored in the signal storage capacitance 73. That is, the charge-voltage conversion gain has a correlation with the signal storage capacitance 73 (i.e., depends on the signal storage capacitance 73), but does not depend on the output-side capacitance of the transfer transistor 62. For this reason, as this embodiment, even in the case the capacitance 66 for pulling up the potential of the charge detection part FD by the signal derived from the drive signal line 68, as well as a capacitance 71 between the charge detection part FD and the transfer signal line 69, are inserted in order to step up the potential of the transfer signal line 69 and so that the capacity of the charge detection part FD increases, the charge-voltage conversion gain does not lower.

Although electrons are adopted as the signal charge in the above-described embodiment, yet it is of course allowable in the present invention to adopt holes as the signal charge under the condition that the photodiode, the MOS transistor, the doped layers, the drive voltages and the like are all inverted in polarity.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An amplification type solid-state image pickup device comprising:
    a pixel section having a photoelectric conversion element that produces an output signal, a transfer transistor connected to the photoelectric conversion element to receive the output signal for transferring signal charge derived from the output signal of the photoelectric conversion element, and an amplification device connected to a charge detection part as an input thereof for amplifying the signal charge transferred to the charge detection part by the transfer transistor; and
    a control unit for, during a first period, controlling a gate voltage of the transfer transistor to a first gate voltage to make the signal charge transfer from the photoelectric conversion element to the charge detection part, and for, in a second period subsequent to the first period, setting a gate of the transfer transistor to a high impedance and moreover for, in the second period, controlling the gate voltage of the transfer transistor to a second gate voltage which provides power for transferring the signal charge to the charge detection part more completely than the first gate voltage alone, wherein
    the control unit includes a drive circuit section and a control section for controlling the drive circuit section, the drive circuit section comprising:
    a switching MOS transistor whose first terminal is connected to the gate of the transfer transistor;
    a first switching element which, in the first period, turns on to make a gate terminal of the MOS transistor connected to ground and which, in the second period, turns off to make the gate terminal of the MOS transistor disconnected from the ground;
    a second switching element which, in the first period, turns on to make a second terminal of the MOS transistor connected to power supply and which, in the second period, turns off; and
    a third switching element which, in the first period, turns off to make a first terminal of the MOS transistor and its gate terminal disconnected from each other and which, in the second period, turns on to make the gate terminal of the MOS transistor and its first terminal connected to each other, wherein
    in the second period, the first switching element and the second switching element turn off, whereby the gate of the transfer transistor is set to a high impedance state.

2. The amplification type solid-state image pickup device as claimed in claim 1, wherein
    the photoelectric conversion element is a buried type photodiode.

3. The amplification type solid-state image pickup device as claimed in claim 1, further comprising
    a drive signal line capacitively coupled with the charge detection part via a first capacitance,
    wherein the control unit, in the second period, outputs to the drive signal line a control signal for controlling the gate voltage of the transfer transistor to the second gate voltage.

4. The amplification type solid-state image pickup device as claimed in claim 1, further comprising a second capacitance connected between the gate of the transfer transistor and the charge detection part.

5. The amplification type solid-state image pickup device as claimed in claim 1, wherein a light receiving area in which a plurality of the pixel sections are arrayed in a matrix shape is formed, the amplification device is a switched capacitor amplifier whose input side is connected to an output side of the transfer transistor and whose output side is connected to an output signal line, and the control unit iterates control operation of reading a signal derived from the photoelectric conversion element via the transfer transistor by the switched capacitor amplifier part in each of the pixel sections.

6. The amplification type solid-state image pickup device as claimed in claim 3, wherein the first capacitance is connected to the charge detection part and the amplification device.

7. An amplification type solid-state image pickup device comprising:

(a) a pixel section having a photodiode, a transfer transistor for transferring signal charge derived from the photodiode, and an amplifier for amplifying signal charge transferred to a charge detection part by the transfer transistor;

(b) a control unit for, during a first period, controlling a gate voltage of the transfer transistor to a first gate voltage to make the signal charge transferred from the photodiode to the charge detection part, and for, in a second period subsequent to the first period, setting a gate of the transfer transistor to a high impedance and moreover for, in the second period, controlling the gate voltage of the transfer transistor to a second gate voltage which allows power of transferring the signal charge to the charge detection part to be enhanced with respect to the first gate voltage, wherein the control unit includes a drive circuit section and a control section for controlling the drive circuit section, the drive circuit section comprising:

(i) a switching MOS transistor whose first terminal is connected to the gate of the transfer transistor;

(ii) a first switching element which, in the first period, turns on to make a gate terminal of the MOS transistor connected to ground and which, in the second period, turns off to make the gate terminal of the MOS transistor disconnected from the ground;

(iii) a second switching element which, in the first period, turns on to make a second terminal of the MOS transistor connected to power supply and which, in the second period, turns off; and (iv) a third switching element which, in the first period, turns off to make a first terminal of the MOS transistor and the gate terminal of the MOS transistor disconnected from each other and which, in the second period, turns on to make the gate terminal of the MOS transistor and a first terminal of the MOS transistor connected to each other, wherein in the second period, the first switching element and the second switching element turn off, whereby the gate of the transfer transistor is set to a high impedance state.

* * * * *